United States Patent [19]

Taniguchi

[11] Patent Number: 5,734,175
[45] Date of Patent: Mar. 31, 1998

[54] INSULATED-GATE SEMICONDUCTOR DEVICE HAVING A POSITION RECOGNIZING PATTERN DIRECTLY ON THE GATE CONTACT AREA

[75] Inventor: Ryota Taniguchi, Kyoto, Japan

[73] Assignee: Rohm Co., Ltd., Kyoto, Japan

[21] Appl. No.: 557,463

[22] Filed: Nov. 14, 1995

[30] Foreign Application Priority Data

Nov. 14, 1994 [JP] Japan .................................. 6-278928

[51] Int. Cl.$^6$ .......................... H01L 23/58; H01L 23/62; G01R 21/36
[52] U.S. Cl. .................. 257/48; 257/288; 257/297; 257/368; 257/328; 257/173; 257/355; 437/8
[58] Field of Search ........................ 257/213, 291, 257/292, 293, 294, 326, 334, 337, 338, 368, 48, 349, 379, 288, 734, 736, 797, 798, 297, 173, 174, 355, 356, 357; 437/8

[56] References Cited

U.S. PATENT DOCUMENTS 4,492,974  1/1985  Yoshida et al. ................... 257/338

FOREIGN PATENT DOCUMENTS 54-7877  1/1979  Japan .......................... 257/48

*Primary Examiner*—Carl W. Whitehead, Jr.
*Attorney, Agent, or Firm*—Baker & Botts, L.L.P.

[57] ABSTRACT

In an insulated-gate type semiconductor device, the gate of an insulated-gate type field effect transistor and its protection element are formed separately from each other. In order to electrically connect the gate with the protection element, a contact region is formed to come into contact with the protection element. On the metallic wiring pattern formed on the contact region, a position recognizing pattern is formed to recognize position of the semiconductor device. Using the metallic wiring pattern, a testing region is also formed to test the withstand voltage. Without increasing the chip size of the semiconductor device, the position recognizing pattern can be formed for the position of the semiconductor device and the testing region for withstand voltage testing can be formed.

13 Claims, 5 Drawing Sheets

INSULATED-GATE SEMICONDUCTOR DEVICE HAVING A POSITION RECOGNIZING PATTERN DIRECTLY ON THE GATE CONTACT AREA

BACKGROUND OF THE INVENTION

1. Field of the Invention

The present invention relates to an insulated-gate type semiconductor device having a protection element and an insulated-gate type field effect transistor.

2. Description of the Related Art

Generally, the insulated-gate type field effect transistor in which a semiconductor substrate is operated as a drain region has a back-to-back diode as a protection element. Where such an insulated-gate type field effect transistor having a protection element (hereinafter referred to as "vertical MOSFET") is formed in a semiconductor chip, in e.g. wire bonding, it is necessary to distinguish the position where the device is to be arranged in the semiconductor chip. For this purpose, a pattern for recognizing the position of the device is formed on the surface of the semiconductor chip.

Provision of the position recognizing pattern on the surface of the semiconductor chip increases the chip size to this degree and results in high cost.

The conventional vertical MOSFET having a protection element does not have a testing area on the chip surface where a probe used in testing a withstand voltage is to be arranged, and so cannot test the withstand voltage. On the other hand, if the area for testing the withstand voltage is formed separately on the chip surface, the chip size is increased to the degree of the testing area resulting in high cost as in the case of the position recognizing pattern.

SUMMARY OF THE INVENTION

An object of the present invention is to provide an insulated-gate type semiconductor device which can form a position recognizing pattern for recognizing the position of the device and a testing area for testing the withstand voltage without increasing the chip size.

In order to attain the above object, according to one aspect of the present invention, there is provided an insulated-gate type semiconductor device comprising: an insulated-gate type field effect transistor having a first conduction type semiconductor substrate serving as a drain, a second conduction type area formed in a main surface of the substrate serving as a channel, a first conduction type area formed in a main surface of the second conduction type area serving as a source, and a semiconductor layer provided through a gate insulating film on the channel between the source and the drain serving as a gate; and a protection element for the gate of the transistor formed separately from the gate, wherein the gate has a contact area for coming into contact with the protection element, and a wiring pattern formed in the contact area includes a position recognizing pattern for recognizing a position of the semiconductor device.

According to another aspect of the present invention, there is provided an insulated-gate type semiconductor device comprising: an insulated-gate type field effect transistor having a first conduction type semiconductor substrate serving as a drain, a second conduction type area formed in a main surface of the substrate serving as a channel, a first conduction type area formed in a main surface of the second conduction type area serving as a source, and a semiconductor layer provided through a gate insulating film on the channel between the source and the drain serving as a gate; and a protection element for the gate of the transistor formed separately from the gate, wherein the gate has a contact area for coming into contact with the protection element, and a wiring pattern formed in the contact area includes a testing portion for testing a withstand voltage of the semiconductor device.

According to still another aspect of the present invention, there is provided an insulated-gate type semiconductor device comprising: an insulated-gate type field effect transistor having a first conduction type semiconductor substrate serving as a drain, a second conduction type area formed in a main surface of the substrate serving as a channel, a first conduction type area formed in a main surface of the second conduction type area serving as a source, and a semiconductor layer provided through a gate insulating film on the channel between the source and the drain serving as a gate; and a protection element for the gate of the transistor formed separately from the gate, wherein the gate has a contact area for coming into contact with the protection element, and a wiring pattern formed in the contact area includes a position recognizing pattern for recognizing a position of the semiconductor device and a testing portion for testing a withstand voltage of the semiconductor device.

BRIEF DESCRIPTION OF THE DRAWINGS

The above and other objects and features of the present invention will be more apparent from the following description taken in conjunction with the accompanying drawings.

DETAILED DESCRIPTION OF THE PREFERRED EMBODIMENTS

Figure 1:
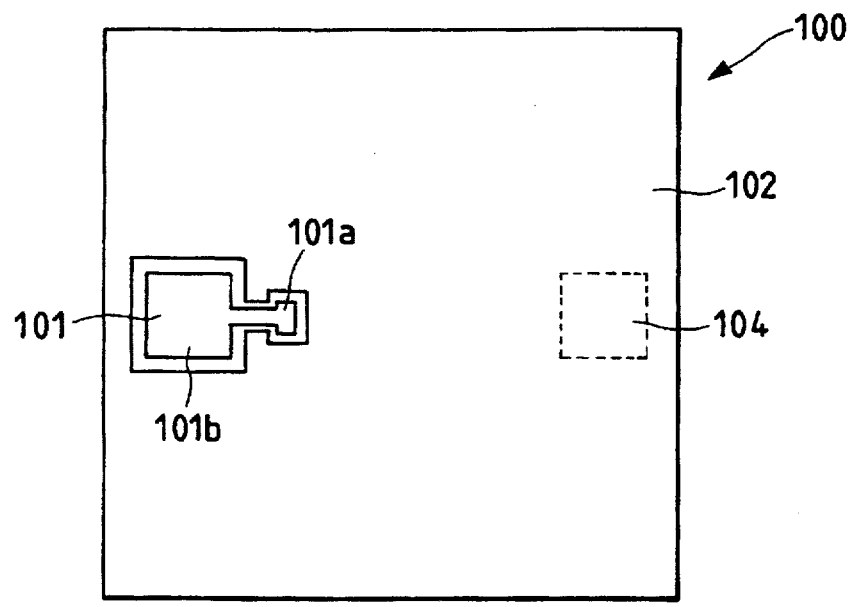
FIG. 1 is an overall plan view of the semiconductor chip of an MOSFET according to one embodiment of the present invention.

FIG. 1 is an overall plan view of the semiconductor chip of a field effect type transistor (hereinafter referred to as "MOSFET") according to one embodiment of the present invention.

In this embodiment, an explanation will be given of an N-channel vertical MOSFET. On the surface of a semiconductor chip 100, a source electrode 102 is formed outside a gate electrode 101 on the substantially entire surface. The gate electrode 101 includes a gate electrode portion 101a which is used as a testing electrode for testing the withstand voltage of the semiconductor chip 100 and another gate electrode portion 101b which is used as a gate-extraction bonding pad to which a wire is to be connected. The source electrode 102 includes a source-extraction bonding pad area 104 to which a wire is to be connected.

Figure 2:
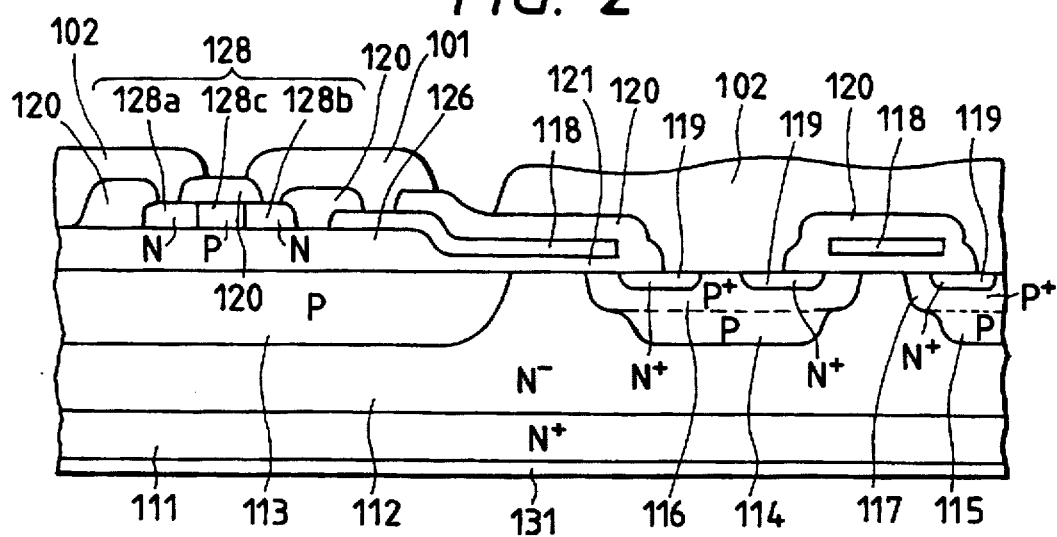
FIG. 2 is a sectional view of an N-channel vertical MOSFET.

FIG. 2 is a sectional view of the N-channel vertical MOSFET.

An N- type epitaxial layer 112 is formed in a main surface of a semiconductor substrate 111 of N+ type silicon. These N+ type semiconductor substrate 111 and N- type epitaxial layer 112 serve as a drain region of the MOSFET. Within the N- epitaxial layer 112, P type well regions 113, 114 and 115 are selectively formed separately from one another.

Within the P type well regions 114 and 115, P+ type regions 116 and 117 which are more shallow than the regions 114 and 115 are formed, respectively. Within these P+ type well regions 116 and 117, N+ type regions 119 are formed in a self-aligned manner with a gate 118. The N+ type regions 119 serve as a source region of the MOSFET. To the N+ type regions 119 and P+ type regions 116 and 117, a source electrode 102 made of e.g. aluminum is connected through a contact hole formed in an inter-layer insulating film 120 made of phosphorus silicate glass (PSG).

On the surface of the P+ type regions 116 and 117, application of a voltage to the gate 118 forms an N channel layer connecting the N- type epitaxial layer 112 (drain region) and the N+ type region 119 (source region) to each other.

Thus, the vertical MOSFET mainly includes the N- type epitaxial layer 112 (drain region), P+ type regions 116, 117 and N+ type regions 119 (source region), gate insulating film 121 and gate 118.

Incidentally, the P type well regions 114 and 115 are provided in order to improve the withstand voltage (drain withstand voltage) of the PN junctions between the N- type epitaxial layer 112 and P+ type regions 116 and 117.

On the surface of the P type well region 113, a field oxide film 126 is formed. On the field oxide film 126, a poly-silicon layer 128 serving as a protection element is formed. The poly-silicon layer 128 is formed separately from the gate 118.

The poly-silicon layer 128 includes N+ type semiconductor portions 128a, 128b and a P type semiconductor portion 128c sandwiched by these N+ type semiconductor portions 128a, 128b. The PN junctions formed between the N+ type semiconductor portion 128a and the P type semiconductor portion 128c and between the N+ type semiconductor portion 128b and the P type semiconductor portion 128c constitute a back-to-back diode serving as a protection element.

To the N+ type semiconductor portion 128a, the source electrode 102 is connected through a contact hole in the protection layer 120 made of phosphorus silicate glass (PSG). To the N+ type semiconductor portion 128b, the gate electrode 101 is connected through a contact hole in the protection layer 120. The gate electrode 101, like the source electrode 102, is made of metallic material such as aluminum. On the other hand, on the back surface of the N+ type semiconductor substrate 111, a drain electrode 131 made of metallic material layer such as aluminum is formed.

Figure 3:
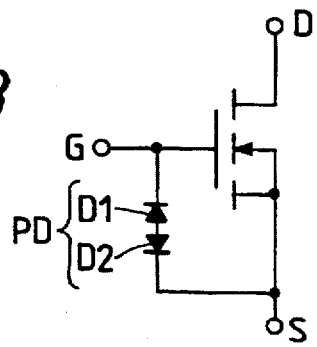
FIG. 3 is an equivalent circuit diagram of the N-channel vertical MOSFET.

The vertical MOSFET shown in FIG. 2 constitutes an equivalent circuit as shown in FIG. 3. As seen from FIG. 3, a back-to-back diode PD consisting of diodes D1 and D2 is connected between the gate G and source S. The diode D1 shown in FIG. 3 includes the N+ type semiconductor portion 128b and the P type semiconductor portion 128c in FIG. 2, and the diode D2 includes the P type semiconductor portion 128c and N+ type semiconductor portion 128a in FIG. 2.

Figure 4:
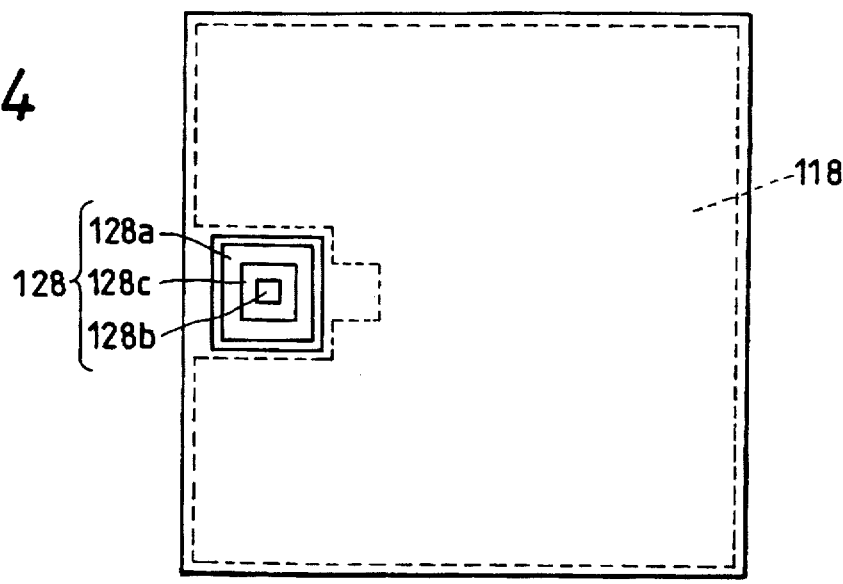
FIG. 4 is a plan view of the entire semiconductor chip showing the position of a protection element.

The N+ type semiconductor portions 128a, 128b and P type semiconductor portion 128c constituting the poly-silicon layer 128 and the gate 118 of poly-silicon as shown in FIG. 2 are formed on the surface of the semiconductor chip as shown in FIG. 4. The gate 118 is formed in a mesh shape as a honeycomb within a dotted line frame in FIG. 4.

Thus, on the surface of the semiconductor chip 100 on which the poly-silicon layer 128 and gate 118 are formed, the gate electrode 101 and source electrode 102 as shown in FIG. 1 are formed.

Figure 5:
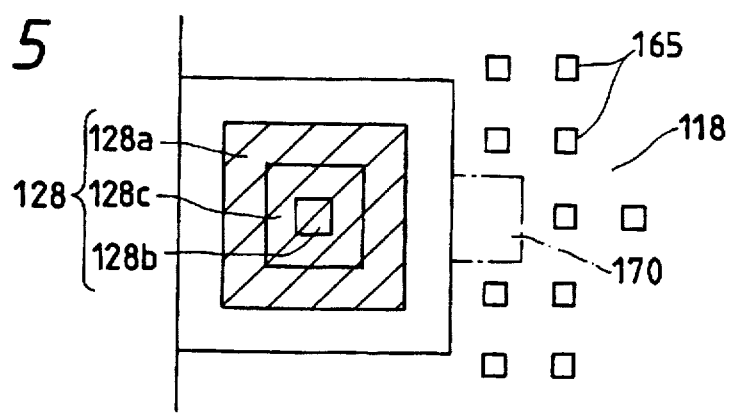
FIG. 5 is an enlarged plan view in the neighborhood of the protection element.
Figure 6:
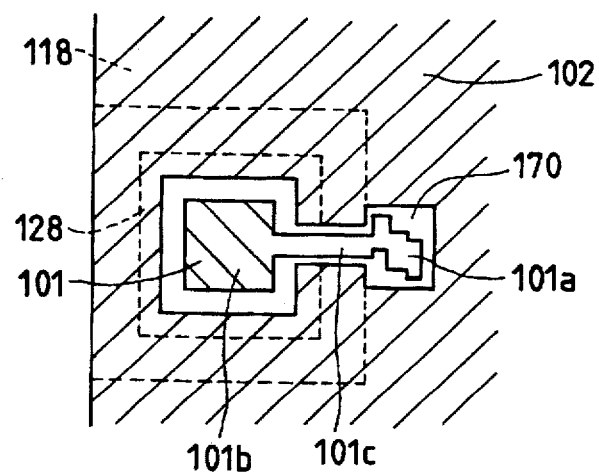
FIG. 6 is an enlarged plan view in the neighborhood of a gate electrode.

FIG. 5 is an enlarged plan view in the neighborhood of the poly-silicon layer 128 before the gate electrode 101 and source electrode 102 are formed. FIG. 6 is an enlarged plan view in the neighborhood of the poly-silicon layer 128 after the gate electrode 101 and the source electrode 102 have been formed.

The area of the poly-silicon layer 128 is formed separately from area of the gate 118. This intends to utilize the chip area in such a manner that the source electrode 102 is in contact with the outermost periphery (N+ semiconductor portion 128a in this embodiment) of the diode portion of the poly-silicon layer 128.

On the entire surface of the gate 118, contact holes 165 for coming into contact with the P+ type well region 114 and the source electrode 102 are formed. On the gate 118, a finger region 170 which serves as a contact area for coming into contact with the poly-silicon layer 128. It should be noted that the finger region 170 does not have the contact hole 165.

As shown in FIG. 6, the source electrode 102 is formed on the entire surface of the semiconductor chip except the outermost periphery (N+ type semiconductor portion 128a) of the diode portion of the poly-silicon layer 128, finger region 170 and an area connecting the poly-silicon layer 128 and the finger region 170. Thus, the source electrode 102 can come into contact with the N- regions 119 serving as a source region formed in the substantially entire zone of the semiconductor chip, and with the outermost periphery of the diode portion of the poly-silicon layer 128.

On the other hand, the gate electrode 101 includes a gate electrode portion 101a formed in the finger region 170, a gate electrode portion 101b formed on the poly-silicon layer 128 and a portion 101c coupling these gate electrode portions, and is formed separately from the source electrode 102. Thus, the poly-silicon layer 128 and the finger region 170 are connected to each other through the gate electrode 101. Accordingly, the poly-silicon layer 128 serving as a protection element and the gate 118 are connected to each other.

Figure 7:
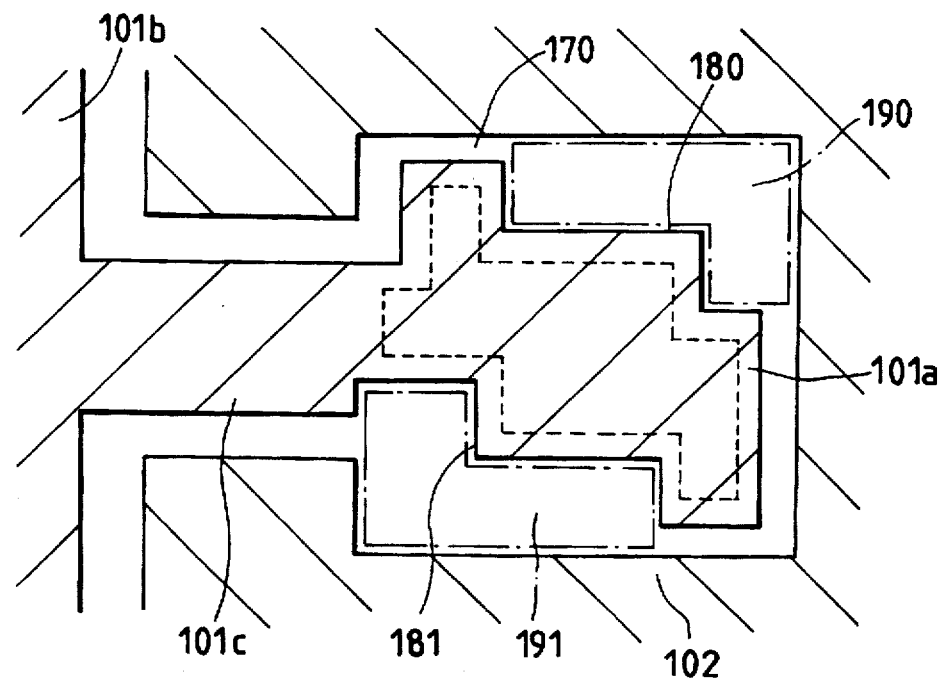
FIG. 7 is an enlarged plan view of a gate electrode portion.

FIG. 7 is an enlarged plan view of the finger region 170. The finger region 170 is formed in a square shape. In an area of the finger region 170 where the gate electrode portion 101a is not formed, a PSG layer formed on the gate 101 is exposed. On the other hand, the pattern of the gate electrode portion 101a of aluminum has recess portions 180 and 181 at opposite corners as shown in FIG. 7. The PSG layer is exposed in areas corresponding to the pair of recess portions 180 and 181. The exposed areas of the PSG layer is used as position recognizing patterns 190 and 191 in assembling process or in wire bonding. Specifically, in position recognition for wire bonding or several kinds of testing, the gate electrode portion 101a of aluminum and the position recognizing patterns 190 and 191 of the PSG layer are digitized by an image pick-up device for position recognition and recognized as white (gate electrode 101a) and black (position recognizing patterns 190 and 191).

The finger region 170 has a square shape having a size with one side of 0.1 mm or so, and the position recognizing patterns 190 and 191 have a size of about 80×50 μm so that the position recognizing patterns 190 and 191 can be easily discriminated.

The gate electrode portion 101a is connected to the gate 118 through the contact hole formed in a position indicated by broken line in FIG. 7.

Figure 8:
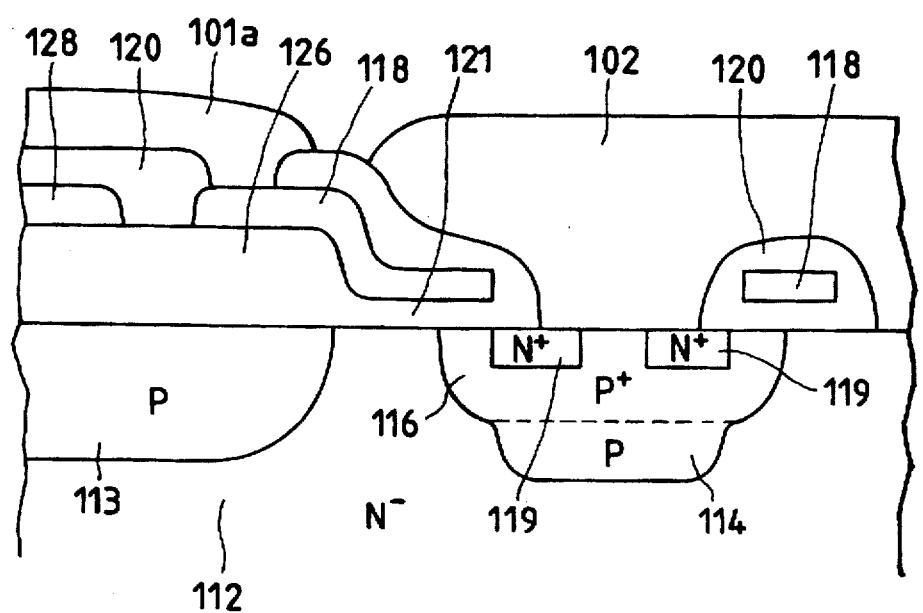
FIG. 8 is an enlarged sectional view of the gate electrode portion.

FIG. 8 is an enlarged sectional view in the neighborhood of the gate electrode portion 101a.

The gate oxide film 121 formed on the P+ type region 116 is formed to have a thickness smaller than that of the field oxide film 126 formed on the surface of the P type well region 113 so that it serves as a gate insulating film. The withstand voltage of the semiconductor chip depends on the film thickness of the gate oxide film 121. Namely, the withstand voltage of the gate oxide film 121 means that of the entire semiconductor chip. In order to evaluate the withstand voltage of the semiconductor chip, the withstand voltage of the gate oxide film 121 must be tested. This is carried out with the gate 118 electrically connected to a probe for measurement of the withstand voltage. Therefore, it is necessary to form a withstand voltage testing portion having a size enough to perform testing on the surface of the chip.

In the present invention, the gate electrode 101 on the finger area 170 is jointly used as the withstand voltage testing portion. The gate 118 is connected to the gate electrode portion 101a of the gate electrode 101 through the contact hole. The center area of the gate electrode portion 101a is set to be larger than the contact area of the edge of the probe so that the withstand voltage testing probe can hold a testable contact state on the gate electrode portion 101a. Thus, the withstand voltage can be tested by bringing the withstand voltage probe into contact with the gate electrode portion 101a of the gate electrode 101 on the finger region 170.

In this way, since the gate electrode 101 on the finger region 170 is jointly used as the withstand voltage testing portion, any withstand voltage testing region is not required separately on the semiconductor substrate surface, thus preventing the chip size from being increased.

Further, since the finger region 170 serving as a contact area of the gate electrode 101 with the gate 118 is used as the withstand voltage testing portion, no particular voltage testing portion other than the finger region 170 is required on the gate 118. The gate 118, therefore, can be effectively used as a gate of the MOSFET.

In this embodiment, the gate oxide film 121 has a thickness of 1000 Å and the field oxide film 126 has a thickness of several thousands of angstrom.

Now referring to FIGS. 9a to 9h, an explanation will be given of the process of fabricating the vertical MOSFET according to this embodiment.

Figure 9A:
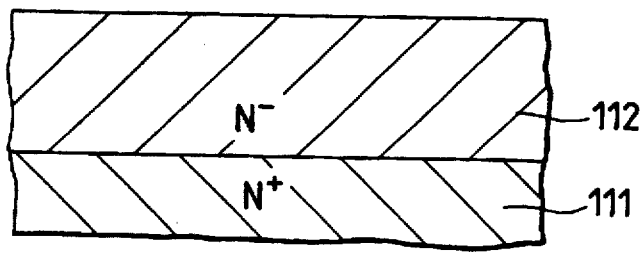
FIGS. 9a to 9h are sectional views showing the fabricating process.

(a) First, the N– type epitaxial layer 112 is formed on the N+ type Si substrate 111 by epitaxial growth (FIG. 9a).

Figure 9B:
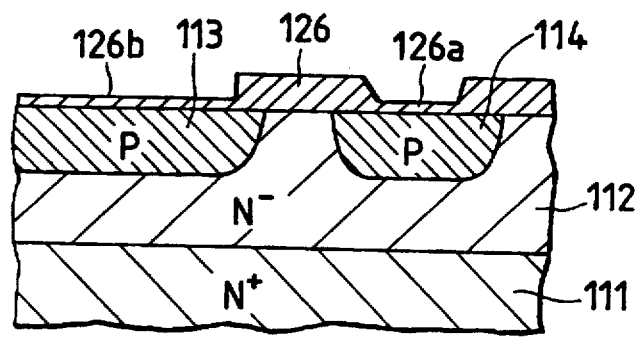

(b) The oxide film 126 is formed by surface thermal oxidation, and the oxide film 126 thus formed is selectively etched except the field portion. Using the oxide film 126 as a mask, boron is deeply ion-implanted to form the P type well regions 113 and 114. After the ion implantation, for annealing, thermal oxide films 126a and 126b are formed on the surface of the P type well regions 113 and 114 (FIG. 9b).

Figure 9C:
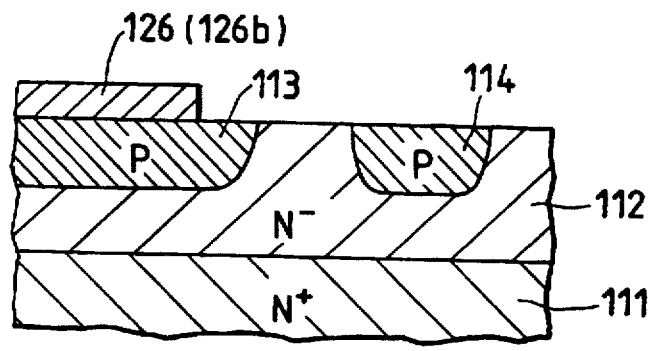

(c) In order to expose the N– type Si layer 112 on which the gate oxide film is to be formed and a portion of the P type well layers 113 and 114, the oxide films 126 and 126a are selectively removed (FIG. 9c).

Figure 9D:
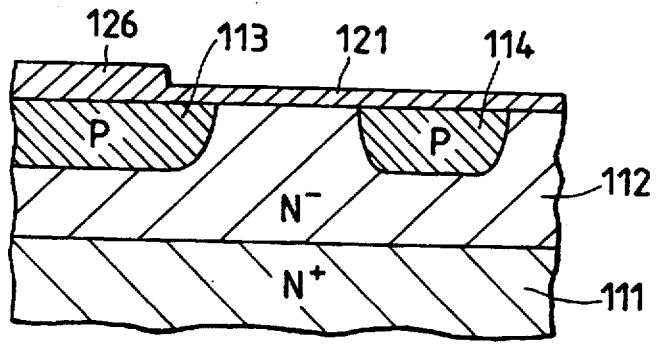

(d) On the surface of the exposed P type well layers 113 and 114 and N– type Si layer 112, the thin gate oxide film 121 is formed by thermal oxidation (FIG. 9d). The gate oxide film 121 serves as a gate insulating film of the MOSFET.

Figure 9E:
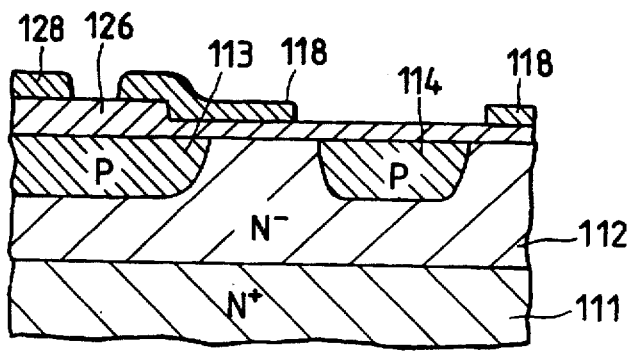

(e) On the surface of the oxide film 126 and the gate oxide film 121, a poly-Si layer is formed by vapor deposition. The poly-Si layer is selectively removed to form the gate 118 and the poly-Si layer 128 serving as the protection element (FIG. 9e).

Figure 9F:
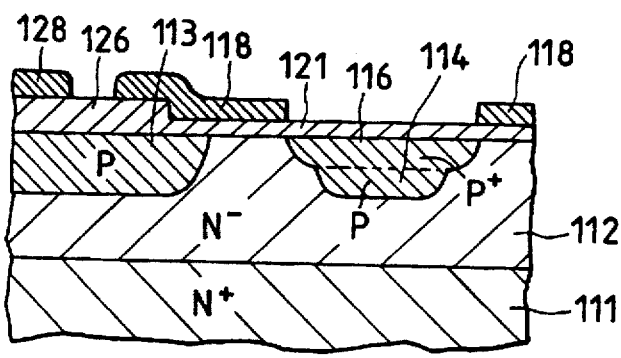

(f) Using the gate 118 and the poly-Si layer 128 as a mask, boron is implanted and annealing is performed to form the P+ type region 116 serving as a channel portion of the MOSFET. Then, boron is also introduced into the gate 118 and the poly-Si layer 128. Thus, the these gate 118 and poly-Si layer 128 becomes to have a P conduction type (FIG. 9f).

Figure 9G:
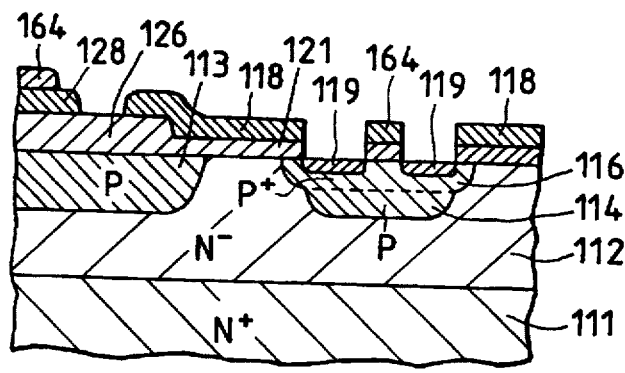

(g) Using the photoresist film 164 and the gate 118 as a mask, the gate oxide film 121 is selectively removed to expose the P+ type region 116. Onto the surface of the exposed P+ type region 116, phosphorus is ion-implanted and annealing is performed to form the N+ type region 119 (FIG. 9g). Additionally, in this process, phosphorus is also introduced in the poly-Si layer 128 to form the N+ type semiconductor portions 128a and 128b. Thus, the protection element having a PN structure is formed.

Figure 9H:
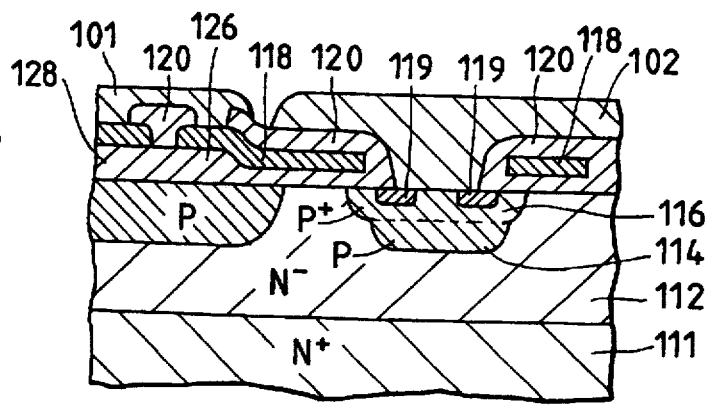

(h) On the entire N– type Si layer, the protection layer 120 of PSG is formed and contact of the protection layer 120 thus formed is photo-etched. Thereafter, by aluminum evaporation and pattern etching, the gate electrode 101 and the source electrode 102 are formed (FIG. 9h).

Specifically, in the pattern etching step, as shown in FIG. 7, the patterns of the gate electrode portion 101a serving as the testing electrode and the gate electrode portion 101b serving as the gate-extraction bonding pad are formed. Thus, the position recognizing patterns 190 and 191 are formed simultaneously. For this reason, according to the present invention, the gate electrode portion 101a as the testing electrode and the position recognizing patterns 190 and 191 for making wire-bonding can be formed by the conventional fabricating process, and no particular fabricating step is required.

According to the present invention, for position recognition, it is not necessary to reduce the area where a transistor is to be formed and form a position recognizing pattern separately, and also for withstand voltage testing, it is not necessary to reduce the area where a transistor is to be formed and form a testing area separately. Thus, without increasing the chip size for the semiconductor device, the area where the transistor is to be formed, particularly the source portion can be effectively used and the performance of the semiconductor device can be improved. Since the areas of the position recognition and the testing portion can be saved, the chip size for the semiconductor device can be decreased.

What is claimed is:

1. An insulated-gate type semiconductor device comprising:

an insulated-gate type field effect transistor having a first conduction type semiconductor substrate serving as a drain, a second conduction type area formed in a main surface of the substrate serving as a channel, a first conduction type area formed in a main surface of the second conduction type area serving as a source, and a semiconductor layer provided through a gate insulating film on the channel between the source and the drain serving as a gate; and a protection element for the gate of said transistor formed separately from the gate, wherein the gate has a contact area for coming into contact with said protection element, and a wiring pattern formed in said contact area includes a position recognizing pattern for recognizing a position of the semiconductor device in assembling the semiconductor device.

2. The insulated-gate type semiconductor device according to claim 1, wherein said protection element includes a back-to-back diode having two or more PN junctions.

3. The insulated-gate type semiconductor device according to claim 1, wherein said protection element is connected between the gate and the source of said field effect transistor.

4. The insulated-gate type semiconductor device according to claim 1, wherein the position recognizing pattern is made of an insulating layer.

5. An insulated-gate type semiconductor device comprising:

an insulated-gate type field effect transistor having a first conduction type semiconductor substrate serving as a drain, a second conduction type area formed in a main surface of the substrate serving as a channel, a further second conduction type area between the first conduction type area serving as a drain and the second conduction type area serving as a channel and having a lower conductivity than the second conduction type area serving as a channel to provide improved drain withstand voltage, a first conduction type area formed in a main surface of the second conduction type area serving as a source, and a semiconductor layer provided through a gate insulating film on the channel between the source and the drain serving as a gate; and a protection element for the gate of said transistor formed separately from the gate, wherein the gate has a contact area for coming into contract with said protection element, and a wiring pattern formed in said contact area includes a testing portion for testing a withstand voltage of the semiconductor device.

6. The insulated-gate type semiconductor device according to claim 5, wherein said protection element includes a back-to-back diode having two or more PN junctions.

7. The insulated-gate type semiconductor device according to claim 5, wherein said protection element is connected between the gate and the source of said field effect transistor.

8. The insulated-gate type semiconductor device according to claim 5, wherein the testing portion includes a gate electrode connected to the gate.

9. An insulated-gate type semiconductor device comprising:

an insulated-gate type field effect transistor having a first conduction type semiconductor substrate serving as a drain, a second conduction type area formed in a main surface of the substrate serving as a channel, a first conduction type area formed in a main surface of the second conduction type area serving as a source, and a semiconductor layer provided through a gate insulating film on the channel between the source and the drain serving as a gate; and a protection element for the gate of said transistor formed separately from the gate, wherein the gate has a contact area for coming into contact with said protection element, and a wiring pattern formed in said contact area includes a position recognizing pattern for recognizing a position of the semiconductor device in assembling the semiconductor device and a testing portion for testing a withstand voltage of the semiconductor device.

10. The insulated-gate type semiconductor device according to claim 9, wherein said protection element includes a back-to-back diode having two or more PN junctions.

11. The insulated-gate type semiconductor device according to claim 9, wherein said protection element is connected between the gate and the source of said field effect transistor.

12. The insulated-gate type semiconductor device according to claim 9, wherein the position recognizing pattern is made of an insulating layer.

13. The insulated-gate type semiconductor device according to claim 9, wherein the testing portion includes a gate electrode connected to the gate.

* * * * *